United States Patent [19]

Powell

[11] Patent Number: 4,581,587

[45] Date of Patent: Apr. 8, 1986

[54] SOLID STATE ELECTRICAL MUSICAL INSTRUMENT AMPLIFIER

[76] Inventor: Brent L. Powell, 310 W. 9th St., St. Anthony, Id. 83445

[21] Appl. No.: 607,934

[22] Filed: May 7, 1984

[51] Int. Cl.$^4$ ............................ H03F 1/34; H03F 3/08
[52] U.S. Cl. ...................................... 330/107; 330/59; 330/109; 330/294; 330/302
[58] Field of Search ................. 330/59, 107, 109, 149, 330/294, 302, 308; 328/167; 307/521, 522, 271

[56] References Cited

U.S. PATENT DOCUMENTS

| 4,107,622 | 8/1978 | Toyomaki | 330/294 X |
| 4,151,477 | 4/1979 | Yokoyama | 330/294 X |
| 4,179,669 | 12/1979 | Dodson et al. | 330/59 X |

Primary Examiner—Eugene R. LaRoche
Assistant Examiner—Steven J. Mottola
Attorney, Agent, or Firm—Mallinckrodt & Mallinckrodt

[57] ABSTRACT

A solid state electrical instrument amplifier includes an instrument signal input, a preamplifier, and circuitry in association with the preamplifier and preferably in a feedback loop of the preamplifier, for adjusting the frequency compensation of the preamplifier. The amplifier may also include distortion circuitry, again preferably located in a feedback loop of the preamplifier, which compresses the peaks of the input signal thereby giving a distorted output of the preamplifier which maintains the relative even and odd harmonic content of the input. The amplifier may also include a variable band reject filter operated by a sweep rate generator which varies the light output of a light emitting diode which in turn varies the resistance of photoresistors in the variable band reject filter. If signal delay circuitry is included to create a reverberation effect, the amplifier also includes a high pass filter in parallel with the delay circuitry to increase the high frequency content of the output signal. In addition, a modified power amplifier may be included with an integrated circuit operational amplifier input D.C. coupled to the rest of the circuit.

20 Claims, 8 Drawing Figures

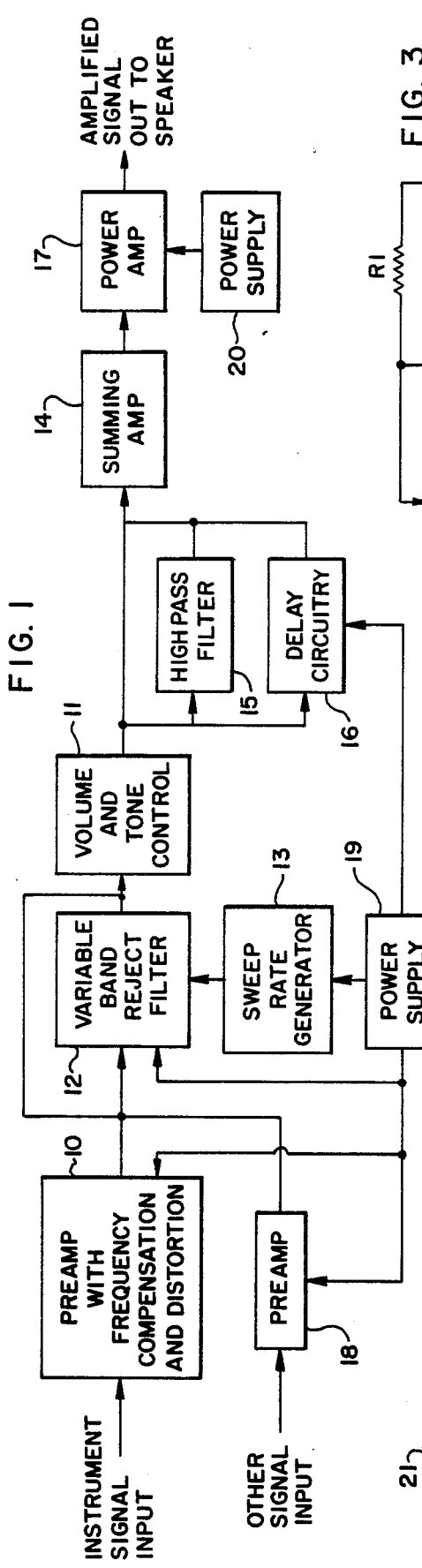
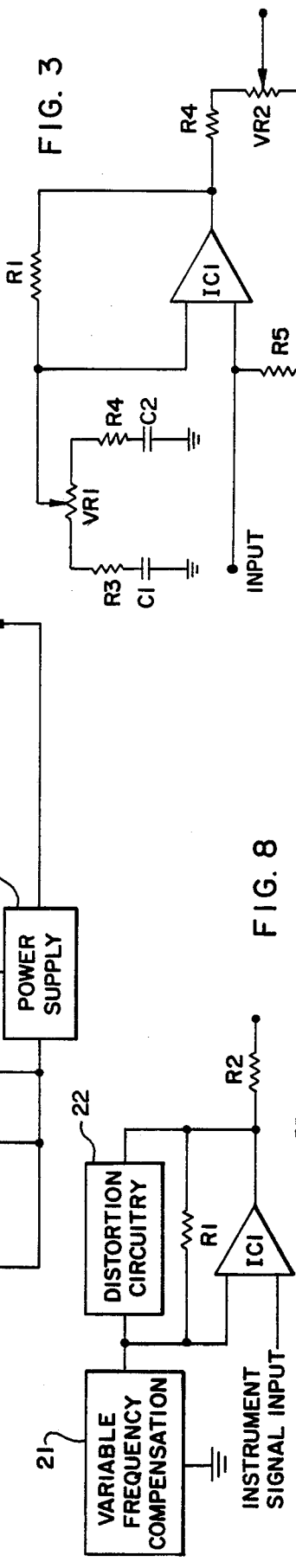
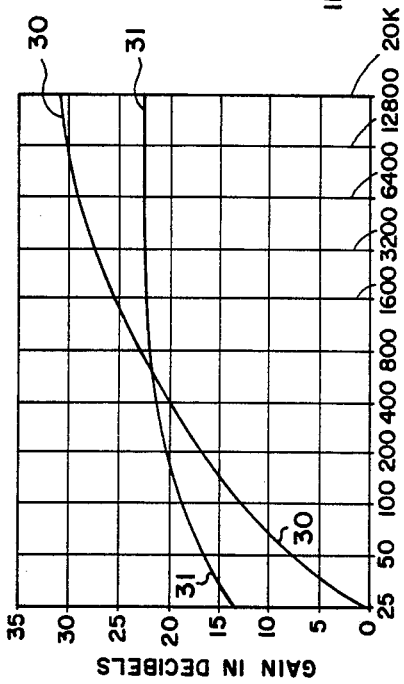
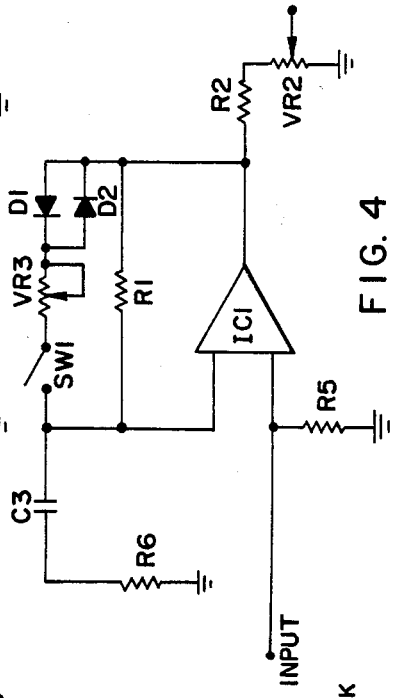

SOLID STATE ELECTRICAL MUSICAL INSTRUMENT AMPLIFIER

BACKGROUND OF THE INVENTION

1. Field

The invention is in the field of amplifiers for musical instruments, particularly instruments such as electric guitars and electric basses.

2. State of the Art

With electrical instruments such as electric guitars and electric basses, the characteristics of the sound produced are not as dependent upon the instrument itself as upon the instrument's pickup and amplifier. The particular pickup used determines the relative amplitude of various frequency signals sent from the instrument to the amplifier. The signal processing done by the amplifier determines the characteristics of the amplified signal, and hence its audio characteristics when the electrical signal is converted to an audio signal by a speaker.

There are currently many instrument amplifiers on the market and each produces a somewhat different instrument sound. The difference may be small between some amplifiers and large between others.

It is not unusual today for a versatile performer to have several instruments and several amplifiers and use one or another depending upon the desired type of music to be played along with its characteristic sound. For example, a performer playing rock music generally desires a hard, driving sound which is characterized by an emphasis on treble volume. On the other hand, a performer playing jazz desires a more mellow sound which is characterized by an emphasis on bass volume, but still producing sharp clear sounds. A performer playing country music will generally prefer an in-between sound.

One of the principal differences between amplifiers, and one that results in the largest difference in the sound produced by the amplifier, is the frequency response of the amplifier. Most electric guitars and electric basses use a wound magnetic type of pick-up to convert string vibrations into electrical signals. These pick-ups are nonlinear, meaning that signals of different frequency produce different amplitude or strength signals. The lower frequency vibrations produce the strongest signal, and the strength of the electrical signal decreases as the frequency increases. To make up for this difference, it is necessary that the amplifier apply what is commonly called frequency compensation. In order that all frequencies of an instrument signal are included in the audio signal produced by the speaker in substantially the strength they are produced by the instrument, it is necessary to compensate for the lower amplitude high frequency signals produced by a magnetic pick-up by adjusting the amplifier so that it amplifies the high frequency signals to a greater degree than the low frequency signals. The amount of frequency compensation, where it occurs, and what frequencies are compensated to what degree are usually designed into an amplifier and are the principal reasons for the substantial differences in the sound of the output from amplifier to amplifier.

Most amplifiers have tone controls which modify the frequency response of the amplifier to some extent upon adjustment of the controls by the user. These controls generally take the form of either high pass or low pass filters in the circuit after the initial pre-amplification of the signal from the instrument pickup. The initial pre-amplification stage is where the frequency compensation takes place. Thus, the tone controls modify the compensated signal and do not act to modify the frequency compensation of the initial pre-amplification stage. Further, the tone controls are generally tied in with the volume controls so that at high volume levels, the tone controls are almost nonfunctional.

Frequency compensation is not as important where a piezoelectric pick-up or a dynamic microphone pick-up are used. These pick-ups are generally substantially linear in their output, so require a substantially linear amplification. With these pick-ups, the tone controls, if they provide a ±10 db tone compensation, will usually be sufficient to give any desired frequency compensation. However, as pointed out above, while such tone controls may operate satisfactorily at lower volume levels, such tone controls may not provide the desired compensation at higher volume levels (those generally used with electric instruments). Thus, even with piezoelectric pick-ups, some frequency compensation is usually required or desired.

In addition to frequency compensation in amplifiers, it is sometimes desired to introduce changes into the signal to give it a special, modified sound. One popular modification is commonly referred to as "distortion". In present amplifiers, this is generally achieved by clipping the sign wave music signal to form a wave similar to a square wave. This produces what is commonly called "fuzz tone". The problem with this procedure is that a square wave emphasizes the odd order harmonics and cancels the even order harmonics in the signal. The cancelling of the even order harmonics produces a harsh and unpleasant sound. It has been found that the most desirable "distortion" signal is one that keeps both the even and odd harmonics in about the same proportion as in the undistored signal.

Another effect often incorporated into an amplifier is the "phase shifting" effect, which produces an ethereal sweeping, swishing sound that seems to surround the listener. This can also produce the effect of a rotating speaker or vibrato. To create this effect, the frequency of a particular sound is first summed to an original frequency and then is gradually subtracted or nulled. While the currently known circuitry for achieving this effect is generally satisfactory, room remains for improvement in the circuitry both from the standpoint of simplicity and operation.

A still further effect usually incorporated into amplifiers is the so-called "reverb" effect, which results from the combination of a signal with a similar, but delayed signal. This produces an echo type of sound. The normal delay lines used in musical instrument amplifiers substantially reduce signals above six kHz thereby reducing substantially the higher frequency signals in the combined signal. No effective way to compensate for this reduction in high frequency signals when using a reverb unit is currently available.

It would thus be desirable to have an instrument amplifier where the frequency compensation of the initial pre-amplifier could be adjusted by the user to adjust for differences in pick-ups being used and to give an adjustable desired type of sound to a particular instrument. It would also be desirable to have an amplifier where the tone control would operate over its full range regardless of the volume setting, and where the distortion circuit would not unduly cancel even harmonics of the signal. Further, it would be desirable to have an amplifier with improved "phase shifting" circuitry and high frequency compensation for use in conjunction with "reverb" circuitry.

SUMMARY OF THE INVENTION

According to the invention, a solid state electrical instrument amplifier includes an instrument signal input means such as a standard phono jack, a preamplifier with means for the musician to adjust the frequency compensation of the preamplifier, and signal output means, such as terminals to connect to a power amplifier. The amplifier will generally include the power amplifier and may include such additional items as distortion means for distorting the signal, band reject filter means for creating ethereal sweeping, swishing sounds, signal delay means for creating reverberation effects, and volume and tone controls.

In a preferred embodiment of the invention, the preamplifier takes the form of an amplifier having negative feedback, with the frequency compensation means located in the negative feedback loop. Such a preamplifier may take the form of an integrated circuit operational amplifier connected as a noninverting amplifier. A feedback resistor is connected between the output of the operational amplifier and its inverting input. A variable resistance-capacitance network is connected between the inverting input and ground as part of the negative feedback loop. Adjustment of the resistance-capacitance network varies the frequency compensation of the preamplifier. By providing the frequency compensation means in the feedback loop of the preamplifier, the frequency compensation may be varied by the musician over a wide range without substantially changing the input or output impedance of the preamplifier. This means that the frequency compensation can be varied over a wide range without changing other characteristics of the amplifier.

A preferred embodiment of the invention also includes distortion circuitry located in the preamplifier negative feedback loop. The distortion circuitry operates to compress the peaks of the input signal and provide a distored output signal of the preamplifier which still substantially maintains the same relative even and odd harmonic content of the input signal. Such circuitry may take the form of two parallel diodes with opposite orientations connected in series with a resistor, the entire diode resistor combination being connected in parallel with the feedback resistor between the output and inverting input of an operational amplifier.

The amplifier of the invention may also include band reject filter means connected between the preamplifier and the signal output means wherein the reject band of the filter is determined by the resistance of two photoresistors. A sweep rate generator, such as a triangle wave generator varies the intensity of the illumination of at least one light emitting diode which is located to vary the illumination on, and thus the resistance of, the photoresistors of the band reject filter.

The amplifier may also include delay circuitry to delay a portion of the signal from the preamplifier and then add it to the nondelayed signal to create a "reverb" effect. With such delay circuitry, a high pass filter is included in parallel with the delay circuitry to increase the high frequency content of the output signal.

The amplifier may also include a power amplifier having an integrated circuit operational amplifier as an input stage so that the power amplifier has a high input impedance and may be D.C. coupled to the rest of the circuitry. This makes it possible to have a completely D.C. coupled amplifier.

THE DRAWINGS

In the accompanying drawings, which illustrate an embodiment of the invention constituting the best mode presently contemplated for carrying out the invention in actual practice:

FIG. 1, is a block diagram of an amplifier for electrical musical instruments which is built according to the invention;

FIG. 2, a circuit diagram, partially in block form, showing the circuitry of the preamp with frequency compensation and distortion block of FIG. 1;

FIG. 3, a circuit diagram showing the circuitry of FIG. 2 with the circuitry of the variable frequency compensation block of FIG. 2, for ease of explanation, not showing the distortion circuitry;

FIG. 4, a circuit diagram showing the circuitry of FIG. 2 with the circuitry of the distortion circuitry block, but, for ease of explanation not showing the variable frequency compensation circuitry;

FIG. 5, a circuit diagram of the preamp with frequency compensation and distortion, preamp, variable band reject filter, and sweep rate generator blocks of FIG. 1;

FIG. 6, a circuit diagram of the volume and tone control, high pass filter, delay circuitry, and summing amp blocks of FIG. 1;

FIG. 7, a circuit diagram of the power amp block of FIG. 1; and

FIG. 8, a graph showing the frequency vs. gain characteristics of the circuitry of FIG. 3.

DETAILED DESCRIPTION OF THE ILLUSTRATED EMBODIMENT

Figure 5:
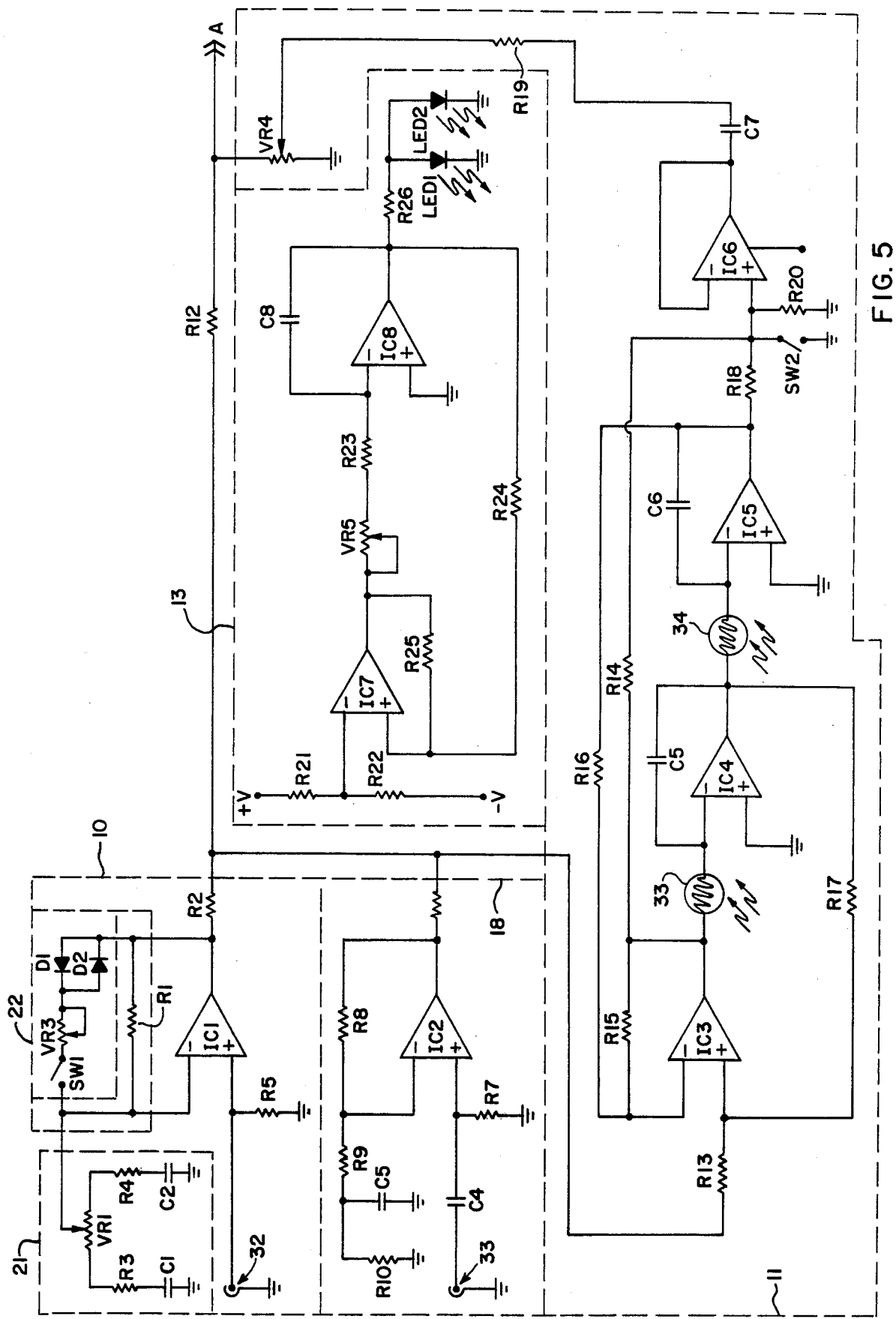

FIG. 1 shows a block diagram of the overall circuitry of an amplifier incorporating all of the features of the current invention. Thus, the signal from an electrical instrument such as an electric guitar or an electric bass is connected to a preamplifier 10 which has variable frequency compensation and adjustable distortion. The output of the preamplifier is a signal which has been compensated to any desired degree for the nonlinearity of the instrument pickup and also to emphasize treble or bass frequencies. Further, if desired, the signal has been distorted to a desired degree by compressing it to provide an effect similar to that commonly known as "fuzz tone", but much more pleasing because even order harmonics are not cancelled from or substantially reduced in the signal. The output of the preamplifier is connected directly to the volume and tone controls 11 and also to a variable band reject filter 12 which can be operated, if desired, to produce the special effect of an ethereal sweeping, swishing sound that seems to surround the listener, or a vibrato sound. The effect is produced by sweeping the rejection frequency of the filter over a range of frequencies and by varying the sweep frequency of the filter. The sweep rate of the filter is controlled by the sweep rate generator 12. The signal from the variable band reject filter is summed at the volume and tone controls with the signal directly from the preamplifier to give the desired effect.

The volume and tone controls 11 are standard and the resulting output signal is then divided with the signal going directly to a summing amplifier 14, to a high pass filter 15 for further treble tone control, and to delay circuitry 16 where it is delayed when desired to create a "reverb" effect. The signals, if any, from the high pass filter and the delay circuitry are summed with the signal as it comes from the tone and volume controls in the summing amplifier 14.

The output of the summing amplifier is further amplified in the power amplifier 17 and supplied to the speakers.

A second preamplifier 18 is provided for input signals from sources not needing variable frequency compensation or added distortion and the output of that preamplifier is connected to the output of preamplifier 10 and is connected to the remaining blocks of the circuitry as indicated above.

A power supply 19 supplies power to the circuitry while power supply 20 supplies power to the power amplifier.

Where a power amplifier is included in the circuitry, the signal output means will generally take the form of terminals for connection of audio speakers. If a power amplifier is not included, the signal output means will generally take the form of terminals for the connection of a separate power amplifier or of other equipment such as recording equipment.

FIG. 2 shows a block diagram of the preamplifier with frequency compensation and distortion as indicated in block 10 in FIG. 1. This shows the preamplifier as an integrated circuit operational amplifier IC1. The frequency compensation is achieved by variable frequency compensation circuitry 21 connected between ground and the inverting input of operational amplifier IC1 as part of the feedback loop. The distortion is obtained by distortion circuitry 22 connected in the feedback loop of IC1 in parallel with normal feedback resistor R1. If only variable frequency compensation or distortion is needed in connection with the preamplifier, only the desired circuit need be used. Both circuits need not be used together, and the distortion circuit will generally be switched in or out of the circuitry as desired. An output isolation resistor R2 is connected in the output of IC1 as shown.

Since the variable frequency compensation circuitry and the distortion circuitry are separate, for ease of illustration and explanation, the preamplifier circuitry incorporating only variable frequency compensation is shown in FIG. 3, while the preamplifier circuitry incorporating only distortion circuitry is shown in FIG. 4. The combined preamplifier circuitry is shown in FIG. 5, along with additional circuitry of the invention.

Referring to FIG. 3, the input, which is the instrument signal input from an electrical instrument such as a guitar, bass, or synthesizer, is connected to the noninverting input of operational amplifier IC1 with IC1 connected in normal fashion as a noninverting amplifier. With such amplifiers, a feedback loop is provided from the output of IC1 through resistor R1 back to the inverting input of IC1. A resistance is also provided between the inverting input of IC1 and ground. Here the resistance is made up of the combination of variable resistor VR1, resistors R3 and R3 and capacitors C1 and C2. While it is common to provide an R-C circuit between the inverting input of an operational amplifier connected as a noninverting amplifier and ground to provide frequency compensation in the gain of the amplifier, such circuit always uses a fixed R-C circuit. In such instance, as the frequency of the input and output signal increases, the capacitive resistance of the R-C circuit is reduced so that more of the feedback signal passes to ground. This reduces the amount of negative feedback to the operational amplifier and increases the overall gain of the amplifier. As the signal frequency decreases, the capacitive resistance of the R-C circuit increases thereby causing an increase of negative feedback to the amplifier and a decrease in the overall gain. Thus, high frequencies have greater gain than low frequencies, the specific gain characteristics being determined by the specific R-C circuit used.

In the circuitry of the invention, the circuit functions as with a fixed R-C circuit, but the R-C circuit is variable. Thus, by changing the adjustment of variable resistor VR1, the value of the R-C circuit is changed. With variable resistor VR1 adjusted so that the wiper is at one limit of its travel (the far left in FIG. 3), the effective impedance of the R-C circuit is the parallel combination of the series connection of capacitor C1 and resistor R3 in one parallel branch and variable resistor VR1, capacitor C2 and resistor R4 in the other parallel branch. With the wiper of variable resistor VR1 at the other limit of its travel (the far right in FIG. 3), the effective impedance of the R-C circuit is the parallel combination of the series connection of variable resistor VR1, capacitor C1 and resistor R3 in one parallel branch and capacitor C2 and resistor R3 in the other parallel branch. These two positions of VR1 determine the two extremes of frequency compensation, with settings of variable resistor VR1 between its extremes giving intermediate settings of frequency compensation. The graph of FIG. 8 shows variations in frequency compensation for a typical circuit of FIG. 3, the line 30 shows the gain vs. frequency characteristics at one extreme setting of variable resistor VR1 and the line 31 shows the gain vs. frequency characteristics at the other extreme setting. The area between the lines show the range of intermediate settings. With this arrangement for varying frequency compensation, the input and output impedance of the overall preamplifier circuit remains substantially constant as the frequency equalization is changed. The output of IC1 is connected through output resistor R2 and variable resistor VR2 to ground. Variable resistor VR2 is shown for explanation purposes and represents the volume control of the amplifier and any other resistances between the output of IC1 and ground. Thus, the DC bias path for the inverting input of IC1 is set by resistors R1 and R2 and variable resistor VR2, however, in terms of bias, VR2 is of substantially constant resistance. In the actual circuitry of FIGS. 5 and 6, the resistance represented by VR2 will vary to some degree but for purposes of explanation of the frequency compensation and distortion circuitry, it is shown as substantially constant. Thus, the DC bias on the inverting input of IC1 remains substantially constant regardless of the setting of the frequency compensation. The DC bias for the noninverting input of IC1 is set by resistor R5 when the instrument input is open, but when a signal source such as a magnetic instrument pickup is connected to the input, the signal source shunts resistor R5 and the resulting DC bias impedance very closely matches the value of R1 to provide a very low output offset voltage of typically less than 20 mv. Under this condition, DC coupling of other subsequent circuitry to this preamplifier stage is possible. Thus, as explained above, the bias condition on IC1 remains substantially constant regardless of the setting of frequency equalization and the offset voltage of IC1 is substantially constant. In this regard, however, it has been found that it is important to keep the value of the variable impedance created by the combination of variable resistor VR1, resistors R3 and R4 and capacitors C1 and C2 less than about one-tenth the resistance value of R1. When greater than about one-tenth the resistance of R1, the offset voltage IC1 will begin to vary.

The gain of the amplifier is provided by the following equation:

$$\text{gain} = \frac{R1}{\frac{(VR1 + R3 + XC1)(R4 + XC2)}{(VR1 + R3 + XC1) + (R4 + XC2)}}$$

where R's represent the resistance values of the indicated resistors, VR1 represents the resistance value of VR1, and XC1 and XC2 represent the AC resistance values of the indicated capacitors at a particular frequency. Further, the above equation is for variable resistor VR1 with its wiper at the extreme left in FIG. 3 so that all of the resistance of VR1 is in sereis with C1 and R3. For the other extreme setting of VR1, VR1 has to be moved from the association with R3 and XC1 to similar association with R4 and XC2. Thus, at the other extreme:

$$\text{gain} = \frac{R1}{\frac{(R3 + XC1)(VR1 + R4 + XC2)}{(R3 + XC1) + (VR1 + R4 + XC2)}}$$

It has been found that for use with magnetic or piezo electric guitar or bass pickups or for use with music synthesizers, the following component values for the circuitry of FIG. 3 give excellent results: R1 - 68K ohms, R2 - 2.2K ohms, R3 - 10k ohms, R4 - 1.8K ohms, R5 - 1.5 meg. ohms, VR1 - 25K ohms linear taper potentiometer, VR2 - 100k ohms linear taper potentiometer, C1 - 0.68 microfarads, C2 - 0.033 microfarads, and IC1 a Texas Instruments TL094CN linear operational amplifier or a National Semiconductor LM 348N operational amplifier.

Using the above gain equation and component values for an arbitrary condition of input signal of 100 mv at 500 Hz, the gain at one extreme of VR1 works out to 16.2 db while at the other extreme of VR1 works out to 15.5 db. In similar fashion, gain calculatons can be made at various frequencies and the results shown in a graph as FIG. 8. Line 30 in FIG. 8 represents the frequency vs. gain curve when VR1 is set so that it is in series with C1 and R3 and line 31 represents the frequency vs. gain curve when VR1 is set so that it is in series with C2 and R4.

The particular circuitry shown is designed for input frequencies between 20 Hz and 20 kHz and an average input signal amplitude of about 100 mv. Above 20 kHz, the circuitry may become unstable and oscillate. Therefore, if it is to be used at frequencies greater than 20 kHz additional circuitry may be needed to reduce gain above that frequency.

FIG. 4 shows IC1 connected as a noninverting amplifier in standard fashion without the frequency equalization circuitry of FIG. 3, but with the distortion circuitry of the invention. Again, the instrument input is connected to the noninverting input of IC1. Feedback from the output of IC1 is connected through resistor R1 to the inverting input of IC1. Resistor R6 and capacitor C3 are connected in normal manner between the inverting input of IC1 and ground, here taking the place of the variable frequency compensation circuitry. Again the DC bias for the inverting input to IC1 is provided by resistors R1 and R2 and variable resistor VR2. R5 is a bias resistor for the noninverting input to IC1 when the input is open. When connected to an instrument, the DC bias for the noninverting input will generally be through the instrument pickup.

The distortion circuit is connected in parallel with feedback resistor R1 and is made up of diodes D1 and D2, variable resistor VR3, and switch SW1. With switch SW1 open, the distortion circuitry is not in the preamplifier circuitry and has no effect on the preamplifier operation. With switch SW1 closed, and variable resistor VR3 set at its maximum resistance, the voltage across the parallel diodes D1 and D2 is of insufficient magnitude to cause forward conduction of the diodes. However as the resistance of VR3 is reduced, the voltage drop across the parallel diode combination begins to increase until forward conduction occurs. The amount of negative feedback is limited by the resistance of resistor R1 which is chosen so that the voltage drop between the output of IC1 and the inverting input of IC1 is never large enough to bring the forward conductance of the parallel diodes to their minimum resistance. The diodes can be controlled from full off to 90% conduction by varying variable resistance VR3. As indicated, the value of resistor R1 is selected to achieve a voltage drop which will not allow the diodes to be turned fully on. The effect of full conduction would result in an output from the preamplifier of a modified square wave which cancells even order harmonics and results in a signal containing predominantly odd order harmonics. The optimum value of resistor R1 will limit the on resistance of the diodes to approximately 70% of their full on resistance. By using the nonlinear portion of the forward resistance of the diodes, i.e. the area between about 0.45 volts and 0.55 volts, a voltage averaging circuit is achieved. With resistor R1 in parallel with the distortion circuit, the net output of IC1 is close in form to a compressed sine wave. The peaks of the output signal are compressed, but not clipped. This results in an output signal having substantially equally reduced even and odd order harmonics and thus still has substantially the same balance of even and odd order harmonics in the distorted signal as in the original signal. This gives a much more pleasing sound than a clipped signal which tends to cancell even order harmonics. The amount and intensity of the distortion effect can be adjusted by adjusting variable resistor VR3.

For the circuitry shown, the following component values have been found satisfactory: VR3 - 50k ohms linear taper potentiometer, R6 - 3.9k ohms, C3 - 0.033 microfarads, D1 and D2 - 1N4002 diodes.

Figure 6:
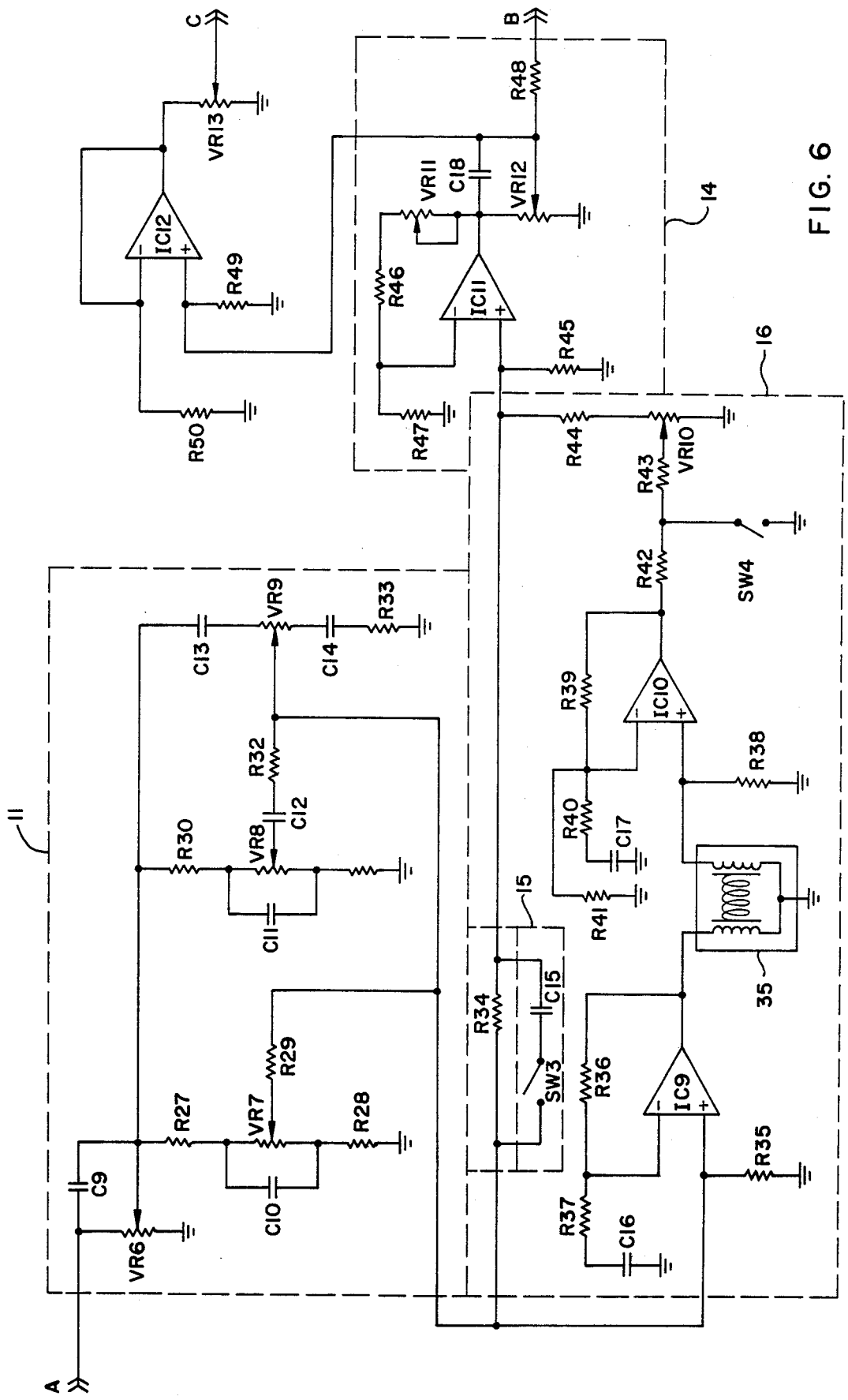
Figure 7:
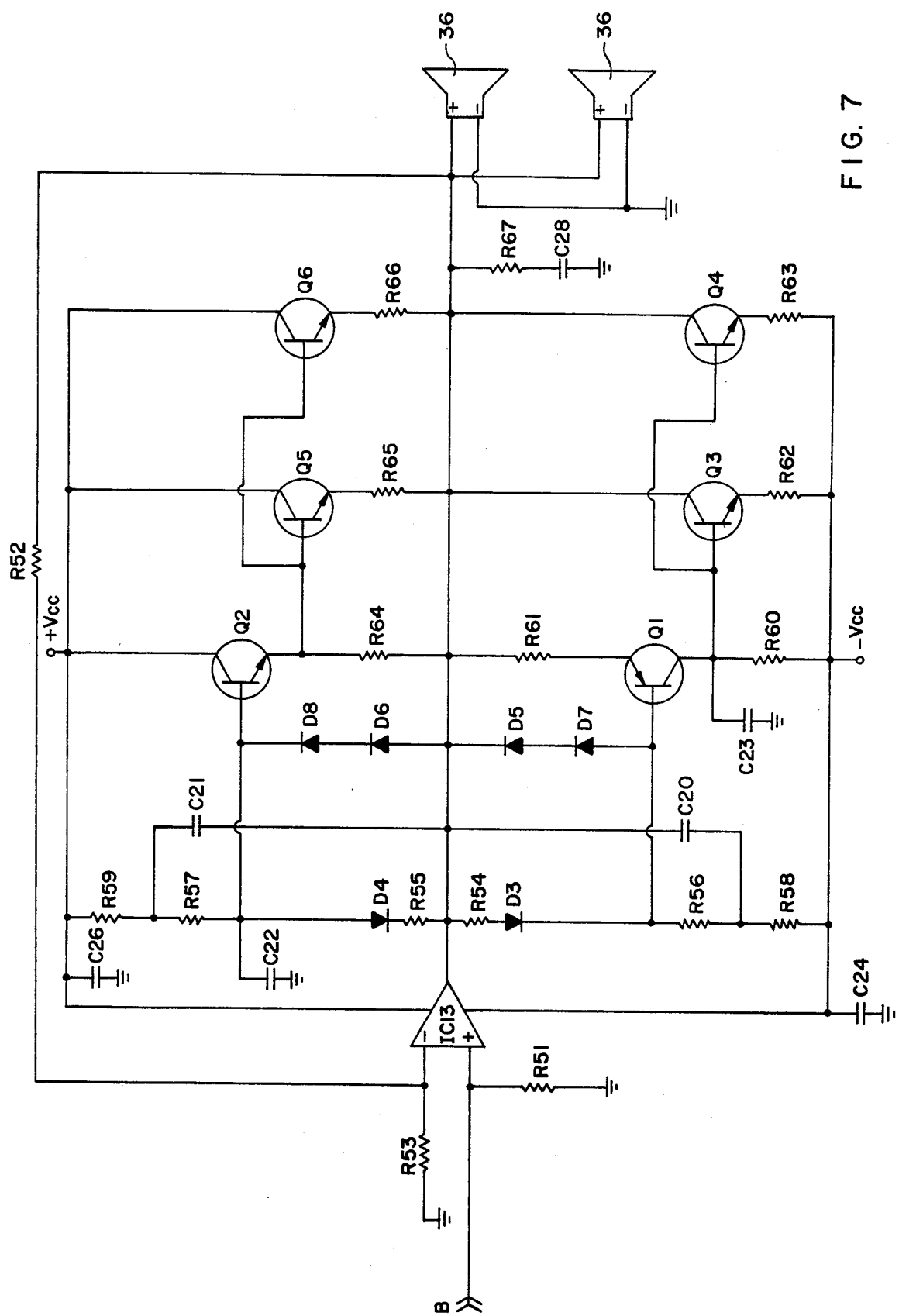

FIGS. 5, 6 and 7 constitute a circuit diagram of a presently preferred embodiment of a guitar amplifier which includes the features of the invention as shown in the block diagram of FIG. 1. The power supplies are not shown since their contruction and operation will be obvious to one skilled in the art.

Referring to FIG. 5, the preamplifier with frequency compensation and distortion is shown as block 10 with the frequency compensation circuitry and the distortion circuitry included in blocks 21 and 22 within block 10. The frequency compensation circuitry and the distortion circuitry is as shown in FIGS. 3 and 4, respectively. Here both the frequency compensation circuitry and the distortion circuitry is combined, but the operation of each circuit is as previously described. Thus, the operation of the preamplifier 10 produces an output signal which has been frequency compensated to the desired extent and, if desired, distorted to a desired extent. The instrument input to preamplifier 10 is shown as a standard phone plug 32 where the lead wire from the instrument is connected in standard fashion to the amplifier circuitry.

A second preamplifier 18 is provided as an auxiliary input to the amplifier to be used when variable frequency compensation or distortion as provided by preamplifier 10 is not desired. For example, preamplifier 18 may be used with a microphone.

The input signal to preamplifier 18 is connected through phone jack 33, and isolation capacitor C4 to the noninverting input of operational amplifier IC2 which is connected similarly to IC1 in a standard noninverting amplifier configuration. Resistor R7 establishes the DC bias on the noninverting input to IC2. Resistor R8 is the feedback resistor connected between the output of IC2 and its inverting input, with resistors R9 and R10 and capacitor C5 connected between the inverting input and ground in standard fashion to provide the desired gain and frequency response. Resistor R11 is an output isolation resistor similar to R4 in preamplifier 10. The DC bias on the inverting input of IC2 is set by a path through variable resistor VR2 which is the volume control shown in FIG. 6, and resistors R11 and R8, as well as resistors R9 and R10 which also provide a DC path from the inverting input to ground.

Satisfactory component values for the preamplifier 18 are R7 - 1 meg. ohms, R8 - 150k ohms, R9 - 10k ohms, R10 - 33k ohms, R11 - 2.2k ohms, C4 -0.068 microfarads, C5 - 0.068 microfarads, and IC2 a Texas Instruments TL094CN linear operational amplifier.

The output of preamplifiers 10 and 18 are connected together and pass through resistor R12 to the volume and tone controls, block 11, through what has been indicated in FIGS. 5 and 6 as connection A. Resistor R12 may have a value of 3.3k ohms. The output of preamplifiers 10 and 18 are also connected as inputs to variable band rejection filter 11. The variable band rejection filter is designed to pass all but a desired frequency and to provide an output signal similar to the input, but with a selected frequency band substantially attenuated. To accomplish this, the variable band rejection filter provides a high pass filter and a low pass filter with the rejected band between.

In the circuitry shown, operational amplifier IC3 forms a high pass filter, operational amplifier IC4 forms a band pass filter which determines the frequencies rejected, and operational amplifier IC5 forms a low pass filter. Operational amplifier IC6 is an impedance isolator and voltage follower for summing the high pass and low pass signals. Resistors R13, R14, R15, and R16 must be equal in value and provide gain control. Capacitors C5 and C6 in conjunction with the resistance of the photo resistive cells 33 and 34, set the center frequency of the rejected band or notch. Capacitors C5 and C6 must be equal in value and photo resistive cells 33 and 34 must have equal resistance values. The "Q" or depth of the center frequency or notch is set by the ratio of the resistance of resistor R17 divided by the resistance of resistor R13. With the high pass and low pass signals summed by IC6, and the band pass nulled by IC3, the result is a band rejection or notch filter. In order to take full advantage of the notch filter, it is necessary to vary the center frequency or notch. This can be done by varying the resistance of resistances 33 and 34 equally. To change the resistance of the photocells requires a low frequency oscillator capable of driving a light emitting element. The photo resistive cells are manufactured using calcium sulfide and therefore their peak response is to light frequency of 560 nanometers wave length.

In operation, the signal from the preamplifiers pass through resistor R13 to the noninverting input of operational amplifier IC3. The output of IC3 is fed through resistor R14 to the noninverting input of operational amplifier IC6 as a high pass signal. Simultaneously, the output of IC3 passes through photocell 33 to the inverting input of operational amplifier IC4, which operates as an integrator to give a band pass output which is fed back to the noninverting input of IC3. This band pass signal is inverted with respect to the original signal and hence nulls to a large extent the input signals of those frequencies. The output of IC4, the band pass signal, is fed through photo cell 34 to the inverting input of IC5. IC5 acts as a low pass filter with its output connected to the inverting input of IC3. This negative feedback cancels the low frequency component of the input signal to IC3. The output of IC5, the low pass signal, passes through resistor R18 and is summed with the output from IC3, the high pass signal, and both are connected to the noninverting input of operational amplifier IC6.

The output signal from IC6 is connected through capacitor C7 and resistor R19, acting as a signal loss resistor, to the wiper of variable resistor VR4. Variable resistor VR4 is connected between the output of the preamplifiers and ground. The output signal from the variable band reject filter is mixed with the signal directly from the preamplifier in any proportional amount or depth by adjustment of the wiper of VR4. Resistor R20 is a bias resistor for IC6, and switch SW2 is preferably a normally closed, foot operated switch positioned to be operated by a performer when operation of the band reject filter is desired. With switch SW2 closed, the output of the filter is grounded and no signal appears on the wiper of VR4 to be mixed with the preamplifier outputs. When switch SW2 is opened, the filter produces an output which is mixed through VR4 with the preamplifier signals.

The following component values have been found satisfactory for the band rejection filter circuitry as shown: R13 through R16 - 15k ohms, R17 - 270k ohms, R18 - 3.3k ohms, R19 - 4.7k ohms, R20 - 47k ohms, C5 and C6 - 0.01 microfarad, C7 - 0.47 microfarad, VR4 - 25k ohms linear taper potentiometer. IC3 through IC6 may be National Semiconductor LM 348N's while the photocells may be Radio Shack number 276-116's. With the photocells used, and a proper variable light source, the range of the filter extends over eight octaves.

The photo cells are used to change the center frequency of the notch filter in a sweeping mode. This is accomplished by modulating light to the photocells to change their resistance. While various methods of modulating light to the photocells can be used, it is presently preferred to use a triangle wave generator to cause varying illumination of two light emitting diodes which in turn, illuminate the photocells to vary their resistance.

A triangle wave generator is shown in FIG. 5 as the sweep rate generator enclosed by box 13. The inverting input of operational amplifier IC7 is connected to a voltage divider made up of resistors R21 and R22. At the instant of startup, using a split power supply of ±18 volts dc, the offset voltage saturates IC7 to give a positive output voltage which is connected to the inverting input of IC8 through variable resistor VR5 and resistor R23. A capacitor C8 is connected as the feedback loop between the inverting input of IC8 and its output. With a positive output on IC7, a current I flows through variable resistor VR5 and resistor R23 to charge capacitor C8. IC8 and capacitor C8 act as an integrator. The output of IC8 is connected through resistor R24 to the noninverting input of IC7, which also receives a feedback signal from the ouput of IC7 through resistor R25. IC8 generates a negative going ramp with a period of rate of I/(VR5)(R23)(C8) volts/second until the output of IC8 equals the negative saturation point of IC7. IC7 then clamps to the negative state and provides a negative current I to the inverting input of IC8. IC8 now generates a positive going ramp with a rate of I/(VR5)(R23)(C8) volts/second until the output of IC8 equals the positive saturation point of IC7 where IC7 again changes output state and the cycle repeats.

Frequency of the triangle wave is determined by the RC time constant which is the combination of variable resistor VR5, resistor R23 and capacitor C8, and the positive and negative saturation voltages of IC7. Amplitude of the waveform is determined by the ratio of resistor R25 to resistor R24, and the saturation voltages of IC7. The output reference center voltage with respect to ground is set by resistors R21 and R22. The output waveform is symmetrical about the positive and negative peaks with respect to ground. Resistor R26 sets the load current magnitude and the associated voltage drop across light emitting diodes LED1 and LED2. The frequency of the generator is regulated by variable resistor VR5. Resistor R23 is used as the upper RC element to limit the upper frequency so the output waveform is not distorted on its positive peaks.

The following component values have been found satisfactory R21 - 22k ohms, R22 - 39k ohms, R23 - 3.3k ohms, R24 - 27k ohms, R25 - 100k ohms, R26 - 910 ohms, VR5 - 500k ohms linear taper potentiometer, and C8 - 22 microfarads. The light emitting diodes provide green light with a wavelength of 560 nanometers and are made by Monsonto Chemical as well as others. The light emitting diodes should be placed within 10 mm of the photocells. IC7 and IC8 are National Semiconductor LM1458N's. It should be noted that while two light emitting diodes are shown, a single light emitting diode could be used if placed so that it illuminates both photocells simultaneously.

With the values given, the period rate of the waveform is a maximum of 33 seconds (0.03 Hz) to a minimum of 0.083 seconds (12 Hz) with an output wave amplitude of +0.8 volts D.C. to +4.8 volts D.C.

As indicated, the signal directly from the preamplifiers 10 and 18, and the signal added in from the variable band reject filter are connected to the volume and tone controls, block 11, FIG. 6, at the connection marked A in FIGS. 5 and 6. With VR4, the musician can adjust the relative amount of phase shifted signal to normal signal he desires, and switch the phase shifted signal on or off with switch SW2.

The signal at point A, FIG. 6, is connected to ground through variable resistor VR6. This variable resistor is the main volume control with the output signal coming from the wiper of VR6. Thus, when the wiper of VR6 is set with maximum resistance between it and ground, the incoming signal at A passes directly to the wiper before passing through any of VR6. The signal is not attenuated to any extent by VR6 and volume is maximum. As the wiper of VR6 is moves so that the signal entering at A must pass through some resistance of VR6 before reaching the wiper, the signal is attenuated and of lesser amplitude and thus the volume is reduced. Capacitor C9 will pass the higher frequencies unaffected by the volume control VR6. It should be noted that VR6 is equivalent to VR2 as shown in FIGS. 3 and 4.

The signal from VR6 is connected to three tone control branches. The bass control is made up of resistors R27, R28, and R29, capacitor C10, and variable resistor VR7. Capacitor C10 will pass the higher frequency signals around variable resistor VR7 so that when the wiper of VR7 is set with maximum resistance to ground, the bass signals will be strongest. When the wiper of VR7 is set with minimum resistance to ground, the base signals will be attenuated by the resistance of VR7 while the treble signals will have been passed by capacitor C10 so the bass signals will have been attenuated in relation to the treble signals. Capacitor C10 is chosen so that all but the desired bass tones are passed. With an instrument amplifier a satisfactory value for C10 is 0.047 microfarad. The remaining components in the bass control may be R27 - 10k ohms, VR7 - 100k ohms linear taper potentiometer, R28 - 1k ohms, and R29 - 6.8k ohms. Resistor R29 is an isolation resistor for the output of the bass control.

The midrange control is made up of resistors R30, R31, and R32, variable resistor VR8, and capacitors C11 and C12. This branch operates similarly to the bass tone control branch, but the capacitor C11 is of a smaller value than capacitor C10 in the bass control so that the signals passed by capacitor C11 around variable resistor VR8 are higher in frequency than the signals passed by capacitor C10 around variable resistor VR7. Thus, the signal passing through VR8 and supplied to the wiper of VR8 contain not only the low frequency bass signals, but also higher frequency midrange signals. The bass signals, however, are blocked by capacitor C12 so that the output from the wiper of VR7 is limited to midrange frequencies. Component values to give a satisfactory midrange tone control are: R30 - 3.9k ohms, R31 - 5.6k ohms, R32 - 4.7k ohms, VR8 - 100k ohms linear taper potentiometer, C11 - 0.0047 microfarads, and C12 - 0.33 microfarads. R32 is an isolation resistor for the output.

The treble control is made up of capacitors C13 and C14, resistor R33 and variable resistor VR9. The high frequencies are passed by capacitors C13 and C14 and are taken off of variable resistor VR9. The lower frequencies are blocked by capacitor C13, so do not appear across VR9. Satisfactory component values are C13 - 0.015 microfarads, C14 - 0.047 microfarads, R33 - 12k ohms, VR9 - 100k ohms linear taper potentiometer.

The signals from the three tone controls are combined and simultaneously sent directly to summing amplifier 14 through loss and isolation resistor R34, to high pass filter 15, and to delay circuitry 16. The delay circuitry is used to create a reverb effect when desired by delaying a portion of the signal which is then added to the signal passing through resistor R34. The delay circuitry uses a standard delay spring reverb unit which substantially attenuates signals above six kHz. For this reason, when the reverb is used, the higher frequencies of the output signal have been substantially reduced. The high pass filter is provided specifically to compensate for this loss of high frequency signals through the reverb unit. It does so by emphasizing the treble tones in the non-delayed signal.

The high pass filter is connected in the circuitry by closing switch SW3 which places capacitor C15 in parallel with resistor R34 to form a high pass filter with the high frequency signals bypassing resistor R34. Switch SW3 allows the filter to be used if and when desired. It has been found that with R34 having a value of 150k ohms and capacitor C15 having a value of 0.0047 microfarads, filter action begins at 23 Hz and steadily increases to 20 kHz. The ultimate slope of +6 db per octive occurs at about 2,258 Hz. This filter action occurs regardless of the volume level of the signal.

The signal entering the delay circuitry of block 16 is connected to the noninverting input of operational amplifier IC9 which is connected in normal manner as a noninverting amplifier. Resistor R35 is a bias resistor for the noninverting input while resistor R36 is the feedback resistor. Resistor R37 and capacitor C16 complete the feedback loop to ground and determine the frequency response of IC9. The purpose of IC9 is to increase the signal strength prior to the delay spring which substantially attenuates the signal.

The input signal to IC9 will generally be in the range of about five volts peak-to-peak with the output of IC9 being about 15 volts peak-to-peak. The output of IC9 is connected to a standard delay spring reverb unit 35 such as a No. 900-0000751 reverb unit made by O.C. Electronics. In the reverb unit, the electrical signal is converted to mechanical vibrations which travel along the spring and are then converted back to electrical signals. When converted back to electrical signals, the signal has been delayed by about 200–300 milliseconds. The signal has also been attenuated about one thousand times and is now about 2 millivolts peak-to-peak. The signal is now connected to the noninverting input of operational amplifier IC10 connected in normal fashion as a noninverting amplifier where the signal is amplified to make up for the loss in the reverb unit. The output signal from IC10 is again about 15 volts peak-to-peak. Resistor R38 is a bias resistor and R39 is a feedback resistor. Resistors R40 and R41 and capacitor C17 complete the feedback loop to ground and determine the frequency response of IC10.

The delayed and amplified signal from IC10 passes through isolation resistors R42 and R44 to variable resistor VR10. Variable resistor VR10 sets the reverb depth, i.e., the strength of the reverb signal which is added to the main signal. The reverb signal passes through isolation resistor R44 where it joins the main signal at the noninverting input to operational amplifier IC11. With the wiper of variable resistor VR10 set with maximum resistance to ground, the maximum reverb signal will be added to the main signal. With the wiper of variable resistor VR10 set with minimum resistance to ground, the reverb signal is essentially grounded so no reverb signal is added to the main signal.

A normally closed switch SW4 is connected to ground between resistors R42 and R43 and when closed, acts to ground the reverb signal. The switch is preferably foot operated so when opened by the foot of a performer causes the delayed signal to be added to the main signal. The reverb depth will have been previously set so activation of the foot switch adds the desired reverb signal.

Satisfactory component values for the delay circuitry are R35 - 390k ohms, R36 - 470k ohms, R37 - 56k ohms, capacitor C16 - 0.033 microfarads, R38 - 1 megaohm, R39 - 1.5 megaohms, R40 -22k ohms, R41 - 33k ohms, C17 - 0.068 microfarads, R42 - 2.2k ohms, R43 - 150k ohms, R44 - 150 k ohms, and VR10 - 100k ohms linear taper potentiometer. IC9 and IC10 may be National Semiconductor LM 348N's.

The combination of the main signal and the reverb signal is amplified by IC11 connected in normal fashion as a noninverting amplifier and serving the purpose of a summing amplifier. Resistor R45 is a bias resistor. The series connection of variable resistor VR11 and resistor R46 provide a variable feedback resistance for IC11. R47 completes the feedback loop to ground. By varying the resistance of VR11, the gain of IC11 may be varied since the gain of IC11 is given by (R46+VR11)/R47.

The output of IC11 is connected across variable resistor VR12 which forms another volume control for the amplifier. The position of the wiper of VR12 will determine the amplitude of the signal connected through the wiper to the remaining circuitry. Capacitor C18 provides an additional high pass filter connected in normal manner with respect to volume control VR12. The signal passing through capacitor C18 is summed with the signal on the wiper of VR12 and forms the output of summing amplifier 14. This output signal passes through isolation resistor R48 to terminal B which is the direct connection to terminal B of the power amplifier shown in FIG. 7. The signal from the summing amplifier, prior to its passage through resistor R48, is connected to the noninverting input of IC12 which is connected as a buffer amplifier to provide an output at terminal C which can be used anytime a preamplifier signal is needed. This can go to an additional power amplifier, to recorders, etc. Resistor R49 is a bias resistor as is resistor R50. Variable resistor VR13 in the output of IC12 provides an additional volume control.

Satisfactory component values for the summing and buffer amplifiers are R45 - 1 megaohm, R46 - 120k ohms, R47 - 51k ohms, VR11 - 2 megaohms linear taper potentiometer, VR12 - 100k ohms linear taper potentiometer, C18 - 0.0022 microfarads, R48 - b 2.2k ohms, R49 - 470k ohms, R50 - 470k ohms, and VR13 - 5k ohms linear taper potentiometer. IC11 and IC12 may be National Semiconductor LM 348N's.

The signal from the preamplifier at terminal B is connected to the power amplifier of FIG. 7, a modified quasi-complimentary Class B power amplifier. The signal enters the power amplifier through the noninverting input of operational amplifier IC13 such as a National Semiconductor LM 343H. Resistor R51 is a bias resistor while resistor R52 is a feedback resistor from the output of the entire power amplifier. Resistor R53 completes the feedback loop to ground. Resistors R54 through R59, along with diodes D3 through D8 provide the bias for the bases of transistors Q1 and Q2. Capacitors C20 and C21 are filter capacitors while capacitor C22 helps prevent oscillation of the amplifier.

Transistor Q1 is connected in series between resistors R60 and R61 between the negative power supply −VCC and the positive terminal of speakers 36. The bases of transistors Q3 and Q4 are connected to the collector of transistor Q1. Capacitor C23 helps prevent oscillation of the amplifier. Resistors R62 and R63 are the load resistors for transisters Q3 and Q4 respectively.

Transistor Q2 is connected in series with resistor R6 between the positive power supply +VCC and the positive terminal of speakers 36. The bases of transistors Q5 and Q6 are connected to the emitter of transistor Q2. Resistors R65 and R66 are the load resistors for transistors Q5 and Q6 respectively. Capacitor C24 is a filter capacitor for the negative power supply while capacitor C26 is a filter capacitor for the positive power supply. The series connection of resistor R67 and capacitor C28 is connected across the speakers to ground.

The following component values have been found satisfactory for the power amplifier: R51-100k ohms, R52 - 2 meg. ohms, R53 - 100k ohms, R54 and R55 - 10 ohms, R56 through R59 - 2.7k ohms, R60 - 100 ohms, R 61 - 2.2 ohms, R62 and R63 - 0.51 ohms, R64 - 100 ohms, R65 and R66 - 0.51 ohms, R67 - 22 ohms, C20 and C21 - 50 microfarads, C22 - 0.0022 microfarads, C23 - 0.033 microfarads, C24 and C26 - 0.068 microfarads, C28 - 0.1 microfarads, D3 through D8 - 1N4003, Q1 - TIP-41C, Q2 - TIP-42C, and Q3 through Q6 - 2N6339. IC13 is a National Semiconductor type LM-343H. The power supply for the power amplifier, block 20, FIG. 1, should supply D.C. voltage of +VCC of about +37.5 volts and −VCC of about −37.5 volts.

The operation of the power amplifier is basically the same as a quasicomplimentary Class B power amplifier except that the usual transistor differential input stage has been replaced with an operational ampifier so that the input signal is introduced at the zero D.C. point. This eliminates the normal input stage transistors from the circuitry and eliminates the need for factory adjustment of the input transistor bias. With the modified circuitry as shown, bias is simple and not as critical with respect to the transistors as is normally the case.

Further, providing an input operational amplifier allows direct D.C. coupling of the amplifier to the rest of the circuit and gives the power amplifier stage a high input impedance, a high slew rate of 2.5 volts per microsecond which provides a power bandwidth of 25K Hz, and gives short circuit protection due to short circuit of the load or short circuits caused by a power supply.

It should be realized that although not shown, each of the integrated circuit operational amplifiers require both positive and negative bias voltages. These are supplied by a power supply, shown as block 19 in FIG. 1, but not shown otherwise, which provides +18 volts and −18 volts to the integrated circuits and to the terminals marked +V and −V in the sweep rate generator 13 of FIG. 5.

From the above description of the circuitry, it will be realized that except for the standard tone controls, the signal modification takes place in feedback loops or by auxilary circuitry so that amplifier input and output impedances are not substantially affected by the signal modification and the adjustment of that modification. Further, satisfactory tone modification can be accomplished merely through varying the frequency compensation of the circuitry without the normal tone controls. Such normal tone controls are not necessary, but are provided merely for added adjustment and for performers who are accustomed to having such adjustments and might object to their not being present.

Further, it will be realized that various individual features of the circuitry may be used in a musical instrument amplifier without including other features of the circuitry.

Whereas this invention is here illustrated and described with specific reference to an embodiment thereof presently contemplated as the best mode of carrying out such invention in actual practice, it is to be understood that various changes may be made in adapting the invention to different embodiments without departing from the broader inventive concepts disclosed herein and comprehended by the claims that follow.

I claim:

1. A solid state electrical instrument amplifier comprising an instrument signal input means; a preamplifier having a feedback loop; distortion means connected in parallel with the feedback loop and having nonlinear resistances versus applied voltage characteristics over at least a portion of its operating range immediately below a preset voltage; means in association with said distortion means for limiting voltages applied to such distortion means to below said preset voltage and causing said distortion means to operate at least partially in said nonlinear portion of its operating range so that said preamplifier compresses the peaks of the input signal and provides a distorted output signal which substantially preserves the relative even and odd harmonic content of the input signal; and signal output means.

2. A solid state electrical instrument amplifier according to claim 1, wherein the distortion means is a parallel connection of two diodes, each diode having an opposite orientation.

3. A solid state electrical instrument amplifier according to claim 2, wherein the preamplifier is an integrated circuit operational amplifier connected as a noninverting amplifier, and wherein the feedback loop is a negative feedback loop which includes a feedback resistor connected between the operational amplifier output and the operational amplifier inverting input.

4. A solid state electrical instrument amplifier according to claim 3, wherein the means for limiting voltages applied to the distortion means is a variable resistor connected in series with the distortion means.

5. A solid state electrical instrument amplifier according to claim 1, wherein there is additionally included a switch in series with the distortion means so that the distortion means can be selectively connected in parallel with the feedback loop.

6. A solid state distortion circuit for use with an electrical instrument amplifier, comprising an instrument signal input means; a preamplifier having a feedback loop; distortion means connected in parallel with the feedback loop and having nonlinear resistance versus applied voltage characteristics over at least a portion of its operating range immediately below a preset voltage; means in association with said distortion means for limiting voltages applied to such distortion means to below said preset voltage and causing said distortion means to operate at least partially in said nonlinear portion of its operating range so that said preamplifier compresses the peaks of the input signal and provides a distorted output signal which substantially preserves the relative even and odd harmonic content of the input signal; and signal output means.

7. A solid state distortion circuit according to claim 6, wherein the distortion means is a parallel connection of two diodes, each diode having an opposite orientation.

8. A solid state distortion circuit according to claim 7, wherein the preamplifier is an integrated circuit operational amplifier connected as a noninverting amplifier, and wherein the feedback loop is a negative feedback loop which includes a feedback resistor connected between the operational amplifier output and the operational amplifier inverting input.

9. A solid state distortion circuit according to claim 8, wherein the means for limiting voltages applied to the distortion means is a variable resistor connected in series with the distortion means.

10. A solid state distortion circuit according to claim 6, wherein there is additionally included a switch in series with the distortion means so that the distortion means can be selectively connected in parallel with the feedback loop.

11. A solid state electrical instrument amplifier comprising an instrument signal input means; a preamplifier; a variable band reject filter for attenuating a variable frequency band of the signal from the preamplifier, the reject band of the filter being controlled by controlling the resistance of two photoresistors in such filter; a sweep rate generator in association with at least one light source so that the output of the sweep rate generator is represented by a variable light output of the light source and said light source being physically arranged in association with the photoresistors so that light from the at least one light source falls upon the photoresistors to control the reject band; means for combining the signal from the variable band reject filter with the signal from the preamplifier in selectable propotions; and signal outputs means.

12. A solid state electrical instrument amplifier according to claim 11, wherein the sweep rate generator is a triangle wave generator and wherein the triangle waves cause a constant variation in the light output of the at least one light source.

13. A solid state electrical instrument amplifier according to claim 12, wherein the at least one light source is at least one light emitting diode.

14. A solid state variable band rejection filter for use with an electrical instrument amplifier, comprising an instrument signal input means; a preamplifier; a variable band reject filter for attenuating a variable frequency band of the signal from the preamplifier, the reject band of the filter being controlled by controlling the resistance of two photoresistors in such filter; a sweep rate generator in association with at least one light source so that the output of the sweep rate generator is represented by a variable light output of the light source and said light source being physically arranged in association with the photoresistors so that light from the at least one light source falls upon the photoresistors to control the reject band; means for combining the signal from the variable band reject filter with the signal from the preamplifier in selectable proportions; and signal output means.

15. A solid state variable band rejection filter according to claim 14, wherein the sweep rate generator is a triangle wave generator and wherein the triangle waves cause a constant variation in the light output of the at least one light source.

16. A solid state variable band rejection filter according to claim 15, wherein the at least one light source is at least one light emitting diode.

17. A solid state electrical instrument amplifier comprising an instrument signal input means; a preamplifier; delay means for delaying a portion of the output signal from the preamplifier; summing means for summing the delayed signal from the delay circuitry with the nondelayed signal from the preamplifier to create a reverberation effect, high pass filter circuitry electrically connected in parallel with the delay means to pass the relatively high frequencies and attenuate the relatively low frequencies in the nondelayed signal to thereby increase the relatively high frequencies in the summed signal.

18. A solid state electrical instrument amplifier according to claim 17, wherein the high pass circuitry includes a resistor connected in parallel with a capacitor both connected in parallel with the delay means.

19. Solid state reverberation circuitry for use with an electrical instrument amplifier, comprising an instrument signal input means; a preamplifier; delay means for delaying a portion of the output signal from the preamplifier; summing means for summing the delayed signal from the delay circuitry with the nondelayed signal from the preamplifier to create a reverberation effect, high pass filter circuitry electrically connected in parallel with the delay means to pass the relatively high frequencies and attenuate the relatively low frequencies in the nondelayed signal to thereby increase the relatively high frequencies in the summed signal.

20. Solid state reverberation circuitry according to claim 19, wherein the high pass circuitry includes a resistor connected in parallel with a capacitor both connected in parallel with the delay means.

* * * * *